(12) United States Patent
Paulsen

(10) Patent No.: US 7,128,526 B2
(45) Date of Patent: Oct. 31, 2006

(54) ANTI-REVERSE FLOW MECHANISM FOR CENTRIFUGAL BLOWERS

(75) Inventor: Frederick D Paulsen, Holiday Island, AR (US)

(73) Assignee: Fasco Industries, Inc., Eaton Rapids, MI (US)

( * ) Notice: Subject to any disclaimer, the term of this patent is extended or adjusted under 35 U.S.C. 154(b) by 191 days.

(21) Appl. No.: 10/838,544

(22) Filed: May 4, 2004

(65) Prior Publication Data

US 2005/0249587 A1 Nov. 10, 2005

(51) Int. Cl.
F04D 29/44 (2006.01)
F24F 7/06 (2006.01)

(52) U.S. Cl. ............... 415/146; 415/211.2; 416/247 R; 454/347

(58) Field of Classification Search ................ 415/146, 415/211.2, 172.1, 147, 26, 47, 49, 212.1; 416/247 R; 454/353, 184, 347, 358, 359; D14/311, 312
See application file for complete search history.

(56) References Cited

U.S. PATENT DOCUMENTS 1,706,280 A * 3/1929 Dyer ........................ 454/353
2,279,425 A * 4/1942 Voysey ..................... 415/146
4,217,816 A * 8/1980 Mancinelli ................. 415/125
6,005,770 A * 12/1999 Schmitt ..................... 454/184
6,386,828 B1 5/2002 Davis et al. ................ 415/147
6,504,715 B1 * 1/2003 Ota et al. ................... 454/184
6,616,404 B1 9/2003 Davis et al. ................ 415/147

* cited by examiner

Primary Examiner—Richard A. Edgar
(74) Attorney, Agent, or Firm—Baker & Daniels

(57) ABSTRACT

A set of cooling air blowers for machines which require cooling air during operation. The blowers each include an outlet having an anti-reverse flow feature for preventing the flow of air into the blower from externally of the machine should the blower fail, thereby ensuring that the remaining operating blowers are able to maintain a normal and adequate flow of cooling air through the air inlet of the machine and outwardly through the outlets of the remaining operating blowers. Each blower generally includes a blower housing having an inlet, an outlet, and an internal cavity in which an impeller is rotatably disposed, the impeller driven by an electrical motor mounted within the blower housing. The outlet of each blower housing includes a plurality of louvers movable between a first, open position in which the louvers are positioned by contact with the airflow upon rotation of the impeller to allow heated exhaust air to exit the blower housing through the outlet, and a second, closed position in which the louvers are positioned by gravity to substantially block the outlet when the impeller is stationary.

22 Claims, 16 Drawing Sheets

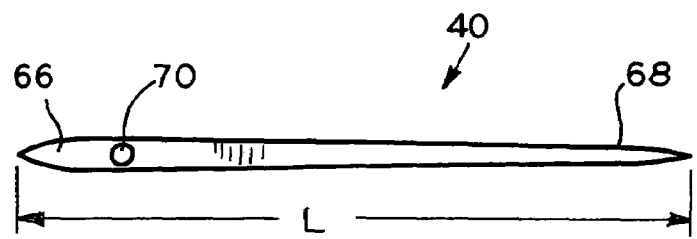
FIG_11
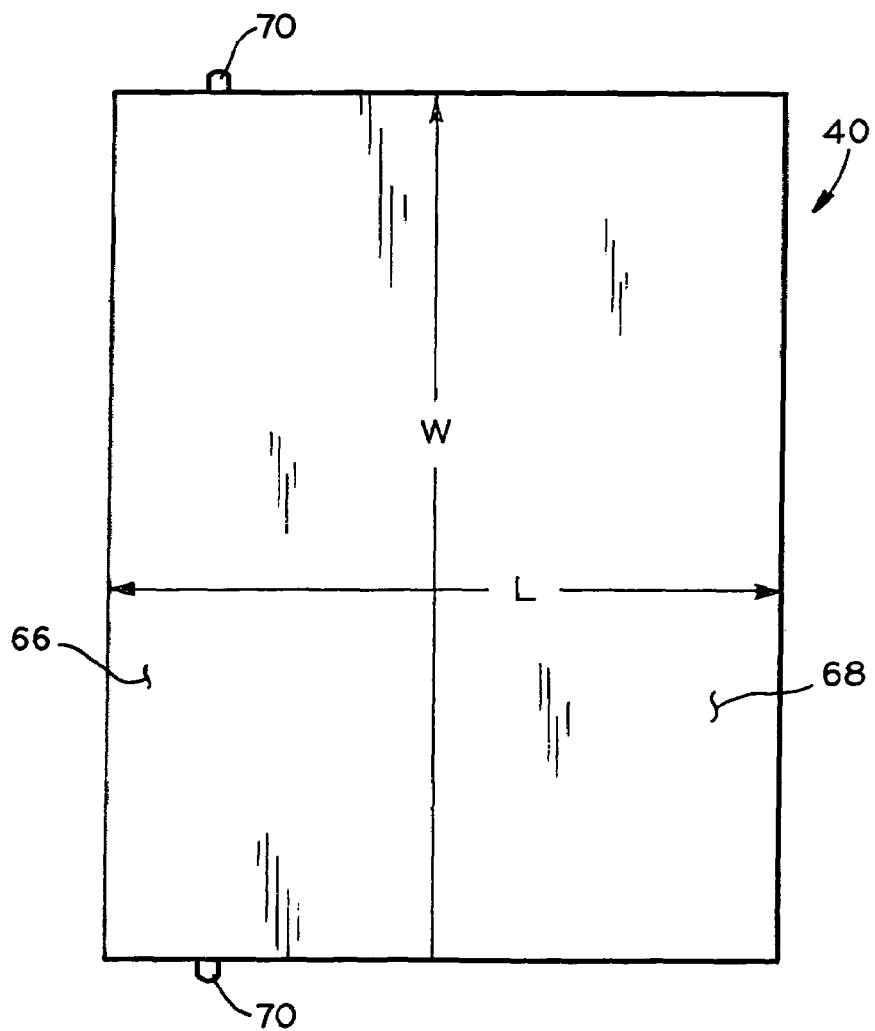
FIG_12

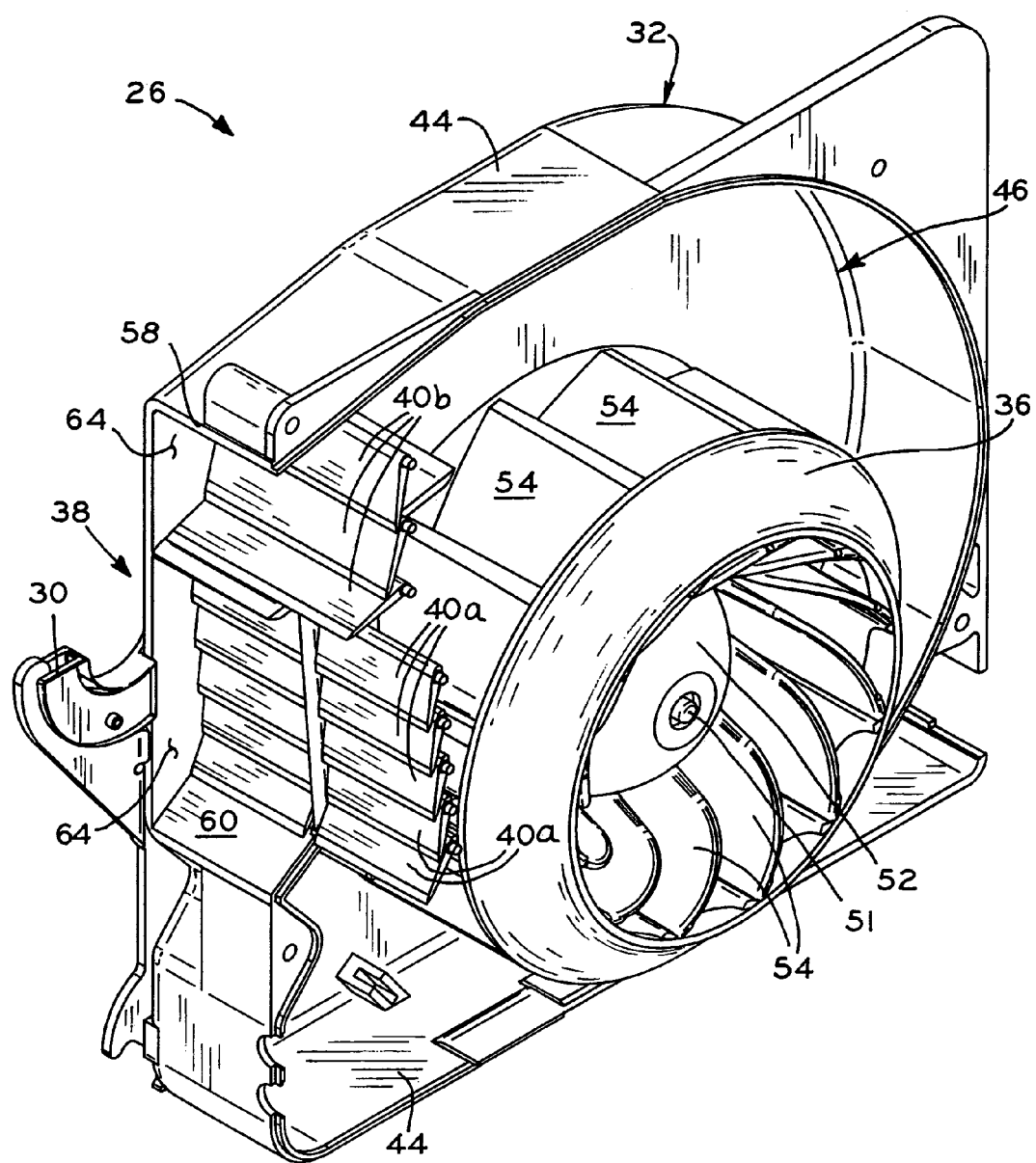
FIG_13

ANTI-REVERSE FLOW MECHANISM FOR CENTRIFUGAL BLOWERS

BACKGROUND OF THE INVENTION

1. Field of the Invention

The present invention relates to blowers for circulating cooling air through machines, and in particular, the present invention relates to blowers which include an anti-reverse flow mechanism.

2. Description of the Related Art

Many electrically-powered machines include a housing in which electrical components such as circuits and motors are contained. During running of the machines, the electrical components within the machines generate heat which must be continuously vented from the machines to cool the internal electrical components. Typically, such machines include one or more internal blowers, each including an electric motor connected to an impeller which is disposed within a blower housing, the blower housing having an inlet in airflow communication with the interior of the machine housing and an outlet in airflow communication with an opening in the machine housing. In operation, rotation of the impeller by the motor draws cooling air from externally of the machine through an inlet in the machine housing, circulates the cooling air across and around the electrical components within the machine to cool the electrical components, and vents the heated exhaust air outwardly of the machine housing through the blower outlets. Many electrical machines include several such blowers to provide increased flow of cooling air, as well as redundancy should one of the blowers fail.

A problem with the foregoing arrangement is that if one of the blowers fails for any reason, the impeller within that blower becomes stationary, yet the outlet of the failed blower remains in airflow communication with the atmosphere externally of the machine. Continued operation of the remaining operable blowers induces a flow of cooling air into the machine through both the air inlet of the machine housing and through the outlet of the failed blower. The foregoing disrupts the normal flow of cooling air through the machine, thereby reducing the effectiveness of the cooling of the internal components of the machine, possibly leading to overheating. Additionally, when a blower fails, disruption of the flow of cooling air places additional operational strain on the remaining operating blowers.

What is needed is an improved blower for use with machines having internal components which require cooling.

SUMMARY OF THE INVENTION

The present invention provides a set of cooling air blowers for machines which require cooling air during operation. The blowers each include an outlet having an anti-reverse flow feature for preventing the flow of air into the blower from externally of the machine should the blower fail, thereby ensuring that the remaining operating blowers are able to maintain a normal and adequate flow of cooling air through the air inlet of the machine and outwardly through the outlets of the remaining operating blowers. Each blower generally includes a blower housing having an inlet, an outlet, and an internal cavity in which an impeller is rotatably disposed, the impeller driven by an electrical motor mounted within the blower housing. The outlet of each blower housing includes a plurality of louvers movable between a first, open position, in which the louvers are positioned by contact with the airflow upon rotation of the impeller to allow heated exhaust air to exit the blower housing through the outlet, and a second, closed position, in which the louvers are positioned by gravity to substantially block the outlet when the impeller is stationary.

The louvers have an airfoil-type profile in cross section, with tapered leading and trailing portions, and the louvers are pivotally mounted within the outlet of the blower housing adjacent their leading portions. In the open position, the airfoil profile of the louvers positions same substantially horizontally upon contact with the airflow from the impeller, and offers minimal resistance to the flow of air around the louvers and through the outlet. In the closed position, the louvers are positioned by gravity in an overlapping arrangement in which the louvers cooperate with one another and with the walls of the outlet to substantially block the outlet and prevent the reverse flow of air into the outlet from externally of the blower.

Thus, when a set of blowers according to the present invention is used for providing a flow of cooling air through a machine, if one of the blowers should fail, the louvers thereof automatically move by gravity to the closed position to block the flow of air through the outlet of the failed blower from externally of the machine. Thus, "reverse flow" of cooling air from outside of the machine through the outlet of the failed blower is prevented. In this manner, should one or more of the blowers fail, the normal flow of cooling air through the machine is not disrupted, and the remainder of the operating blowers continue to draw cooling air solely through the cooling air inlet of the machine and exhaust the heated exhaust air through the outlets of the operating blowers.

Further, the louvers are operable in the above-described manner in two different physical orientations of the blower. Thus, the blower may be selectively positioned in a first or "up" orientation or in a second, or "down" orientation in which the blower is inverted 180° from the first orientation, with the louvers operable in either position to prevent reverse flow of cooling air through the blower.

In one form thereof, the present invention provides, in combination, an enclosure having at least one inlet; and a blower mounted in the enclosure, the blower including a blower housing having an outlet; an impeller rotatable within the housing and positioned to generate an airflow through the at least one inlet of the enclosure to the outlet; at least one louver disposed proximate the outlet, the louver moveable between a first position in which the louver is positioned by contact with the airflow upon rotation of the impeller to allow the airflow to exit the blower housing through the outlet, and a second position in which the louver is positioned by gravity to substantially block the outlet when the impeller is stationary.

In another form thereof, the present invention provides, in combination, an enclosure having at least one inlet; and a blower mounted in the enclosure, the blower including a blower housing having an outlet; an impeller rotatable within the housing and positioned to generate an airflow through the at least one inlet of the enclosure to the outlet; at least two louvers movably mounted to the blower housing proximate the outlet, the louvers moveable between a first position in which the louvers are positioned by contact with the airflow upon rotation of the impeller in a substantially parallel relationship with respect to one another, and a second position in which the louvers are positioned by gravity in overlapping relationship with respect to one another to substantially block the outlet when the impeller is stationary; whereby in the first position, the louvers allow the airflow to pass through the outlet, and in the second position, the louvers substantially prevent passage of air through the outlet from externally of the blower housing.

In a further form thereof, the present invention provides, in combination, an enclosure having at least one inlet; and a blower set, including at least two substantially identical blowers mounted in the enclosure, one blower disposed in an inverted orientation with respect to another of the blowers, each blower including a blower housing having an outlet; an impeller rotatable within the housing and positioned to generate an airflow through the enclosure inlet to the outlet; at least one louver disposed proximate the outlet, the louver moveable between a first position in which the louver is positioned by contact with the airflow upon rotation of the impeller to allow the airflow to exit the blower housing through the outlet, and a second position in which the louver is positioned by gravity to substantially block the outlet when the impeller is stationary.

BRIEF DESCRIPTION OF THE DRAWINGS

The above-mentioned and other features and advantages of this invention, and the manner of attaining them, will become more apparent and the invention itself will be better understood by reference to the following description of an embodiment of the invention taken in conjunction with the accompanying drawings, wherein:

FIG. 11 is a side view of a louver;

FIG. 12 is a top/bottom plan view of the louver of FIG. 11;

FIG. 13 a perspective view corresponding to FIG. 5, showing the blower disposed in an orientation inverted 180° with respect to the orientation shown in FIG. 5;

Corresponding reference characters indicate corresponding parts throughout the several views. The exemplification set out herein illustrates one preferred embodiment of the invention, in one form, and such exemplification is not to be construed as limiting the scope of the invention any manner.

DETAILED DESCRIPTION

Figure 1:
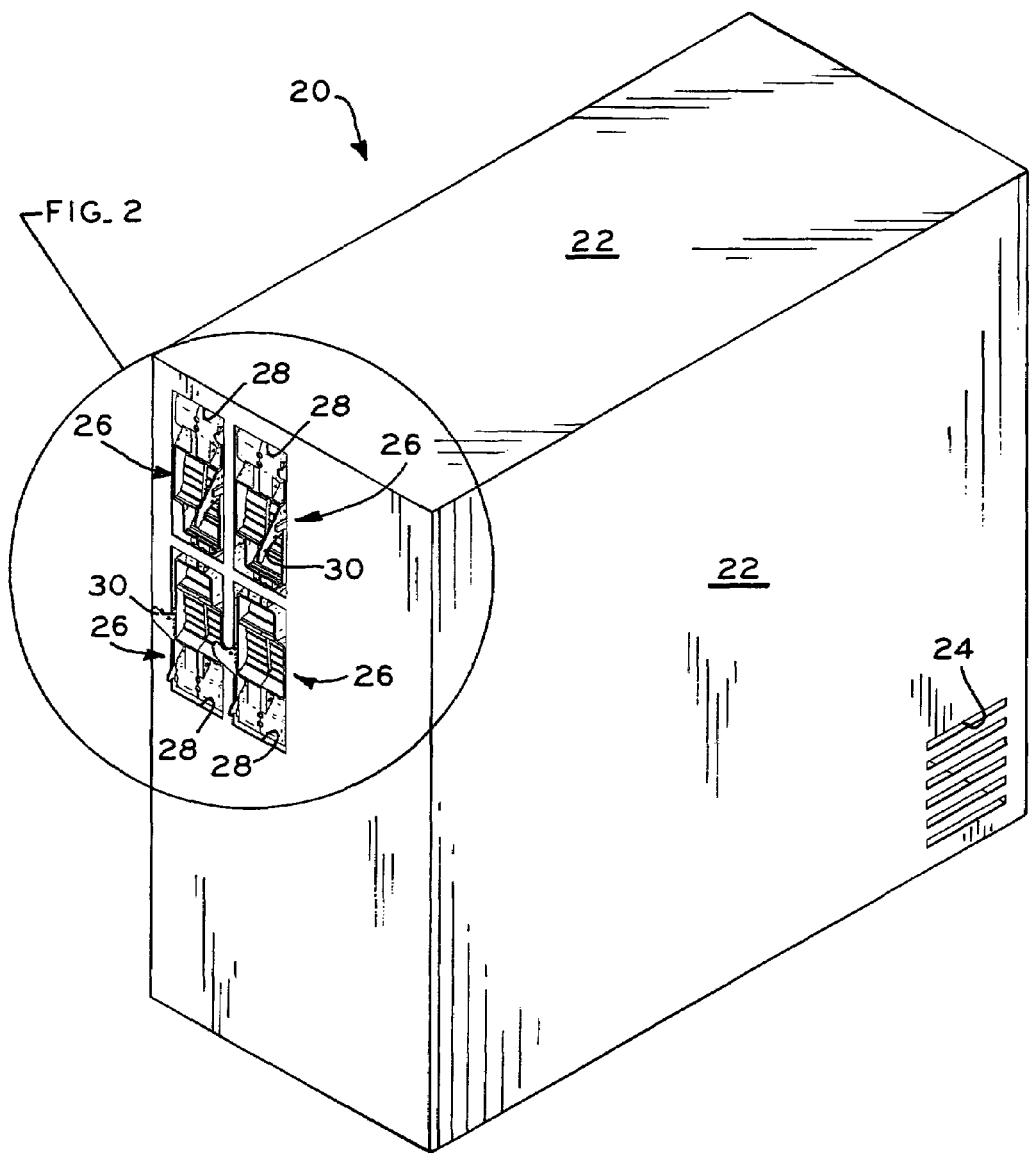
FIG. 1 is a perspective view of an electrical machine, including a housing having a cooling air inlet and a plurality of blowers according to the present invention.
Figure 2:
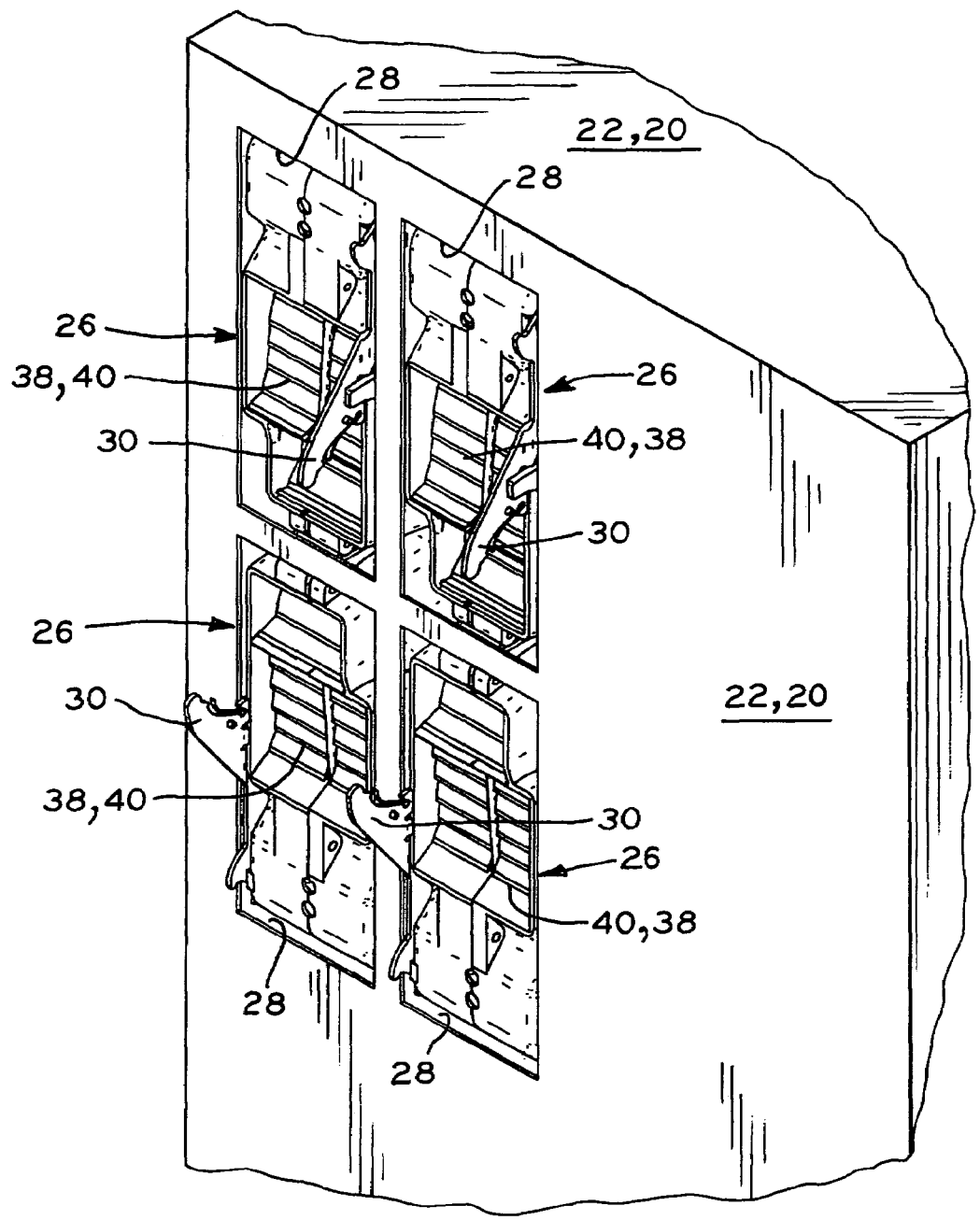
FIG. 2 is a fragmentary perspective view of a portion of the machine of FIG. 1, showing the plurality of blowers.

Referring to FIG. 1, electrical machine 20 is shown, which may be a computer server, for example, or any other machine which includes a housing having internal electrical components such as circuit boards and electric motors, for example, which generate heat during operation and must therefore be cooled by a flow of cooling air through the machine while the machine is operating. Machine 20 generally includes a box-shaped housing 22 having a cooling air inlet 24, which is shown in FIG. 1 in the form of a plurality of slots in housing 22. A plurality of blowers 26, four of which are shown in FIGS. 1 and 2, are mounted within corresponding blower cavities 28 in housing 22 of machine 20. Latches 30 are pivotally mounted to blowers 26, and releasably engage cooperating latching structure (not shown) disposed within blower cavities 28 to secure and lock blowers 26 within blower cavities 28 of machine 20. Although blowers 26 are sized and adapted to be inserted within blower cavities 28 of machine 20 in a cartridge-type manner in use, blowers 26 are shown in FIGS. 3–16 disposed externally of machine 20 for clarity.

As shown in FIGS. 3–6 and discussed in further detail below, each blower 26 generally includes a blower housing 32, a small electric motor 34, and an impeller 36 drivably coupled to the motor 34 and rotatable within the blower housing 32 to generate an airflow through the blower 26 which exits through outlet 38 of the blower 26. When machine 20 is operating, the four blowers 26 of FIGS. 1 and 2 operate together to induce a flow of cooling air through cooling air inlet 24 of housing 22 into machine 20 and around the internal electrical components within housing 22 of machine 20. Thereafter, blowers 26 discharge the heated exhaust air outwardly of machine 20 through the several outlets 38 of blowers 26. In this manner, the constant flow of cooling air through housing 22 of machine 20 cools the internal electrical components of machine 20.

As discussed in detail below, each blower 26 includes an anti-reverse flow feature in the form of a plurality of louvers 40 at the outlet 38 of each blower 26. The louvers 40 are openable upon contact with the airflow through the blower 26 during rotation of impeller 36, and automatically close by gravity when impeller 36 is stationary and when there is no airflow through the blower 26, such as when the blower 26 is turned off or the blower 26 otherwise fails to operate, for example. Advantageously, if one of blowers 26 should fail, the louvers 40 at the outlet 38 of the failed blower 26 automatically close to prevent cooling air from being drawn by the remaining operating blowers 26 through the outlet 38 of the failed blower 26 internally into housing 22 of machine 20, which could disrupt the normal flow of cooling air through housing 22 of machine 20. In this manner, if any blower 26 should fail, the remaining operable blowers 26 do not draw cooling air through the outlet 38 of the failed blower 26, but rather continue drawing cooling air solely through cooling air inlet 24 of machine 20 to maintain the normal flow of cooling air through machine 20.

Referring to FIG. 2, each of the four blowers 26 is identical in construction, with the upper pair of blowers 26 in FIG. 1 oriented in a first orientation, and the lower pair of blowers 26 in FIG. 1 oriented in a second orientation which is inverted 180° with respect to the orientation of the upper pair of blowers 26. However, as described below, regardless of the orientation of blowers 26, the louvers 40 of the blowers 26 are operable in the same manner to prevent the flow of cooling air through outlet 38 into the blower housing 32 of a failed blower 26.

Figure 3:
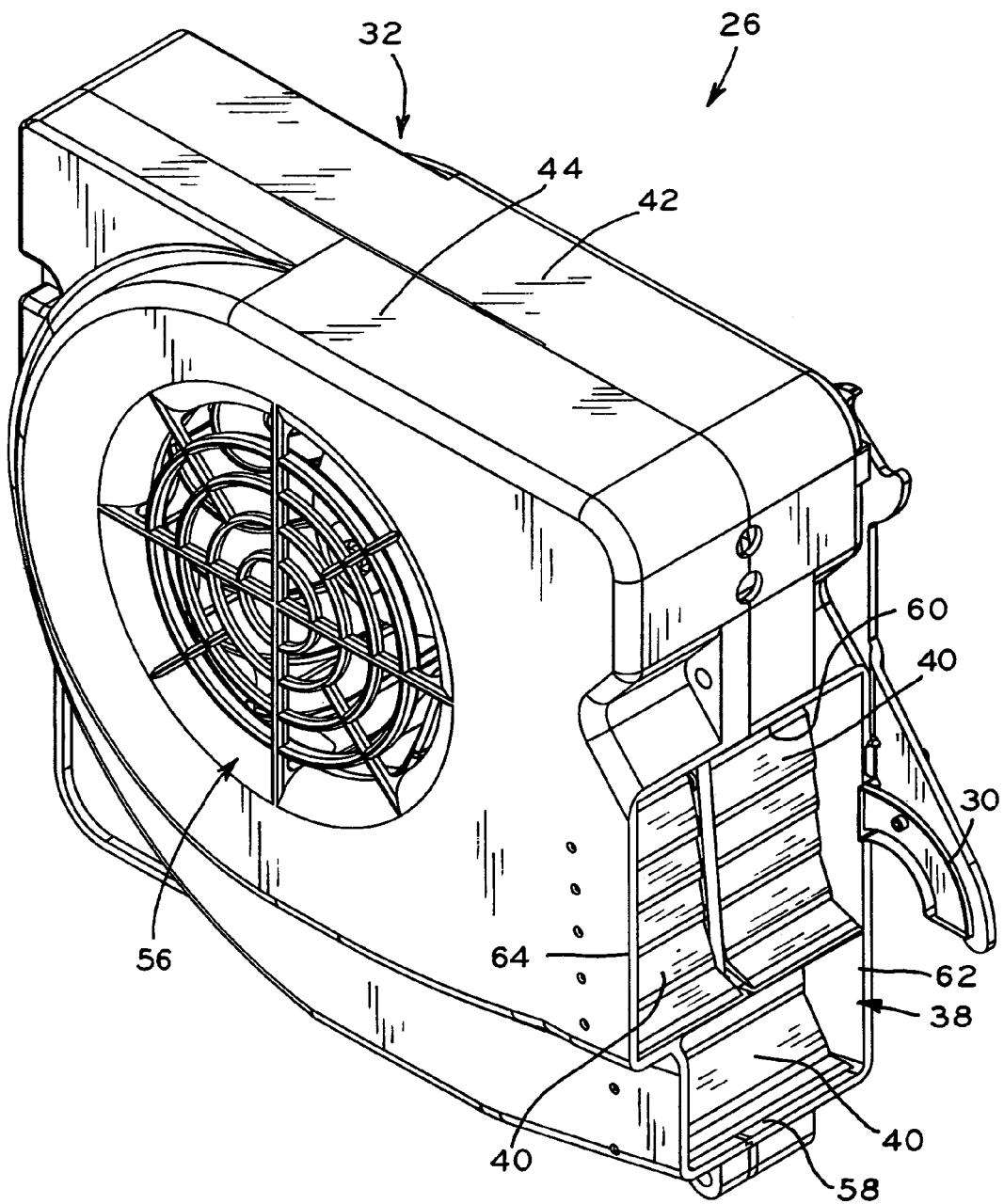
FIG. 3 is a perspective view of a blower according to the present invention.
Figure 4:
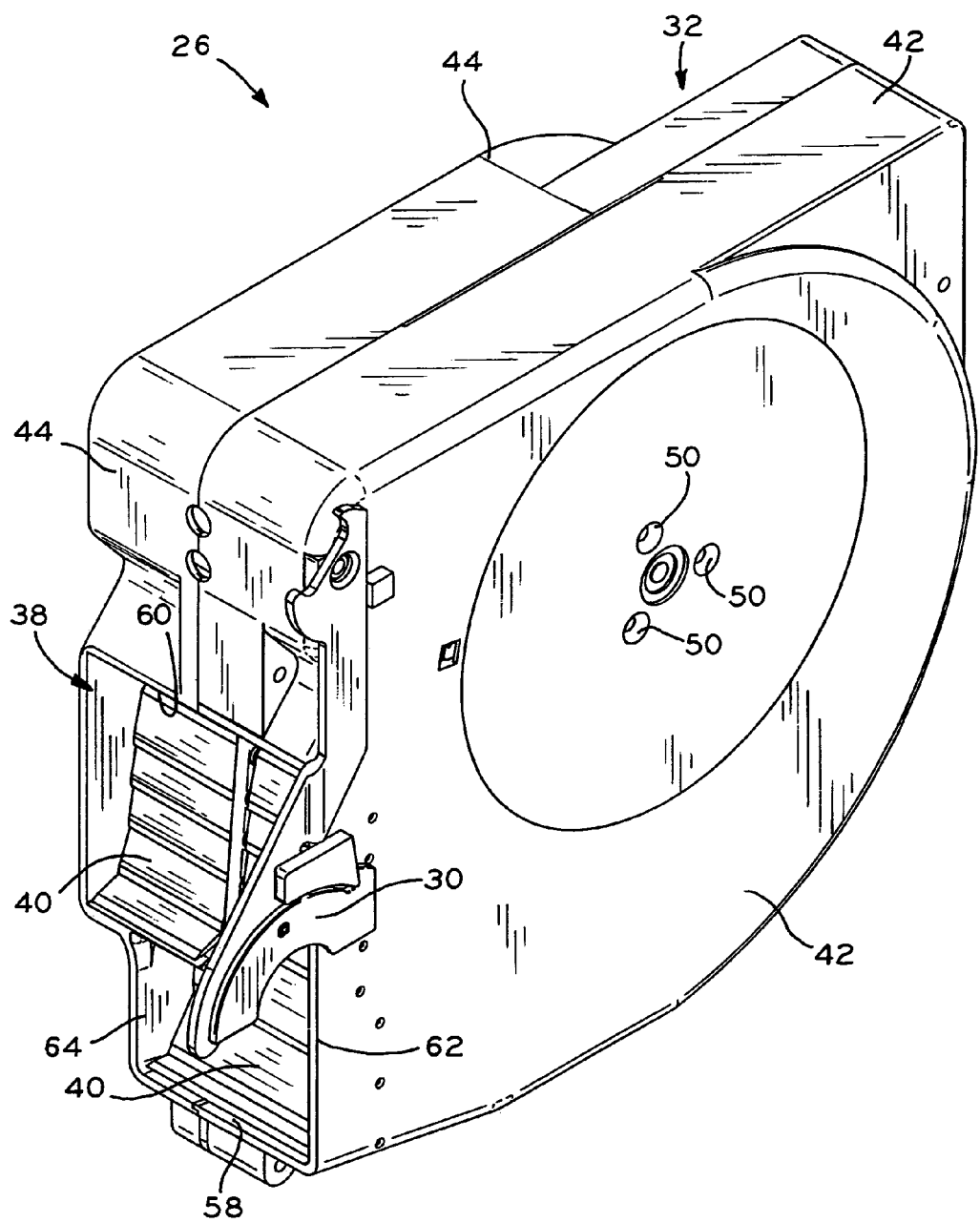
FIG. 4 is another perspective view of the blower of FIG. 3.
Figure 5:
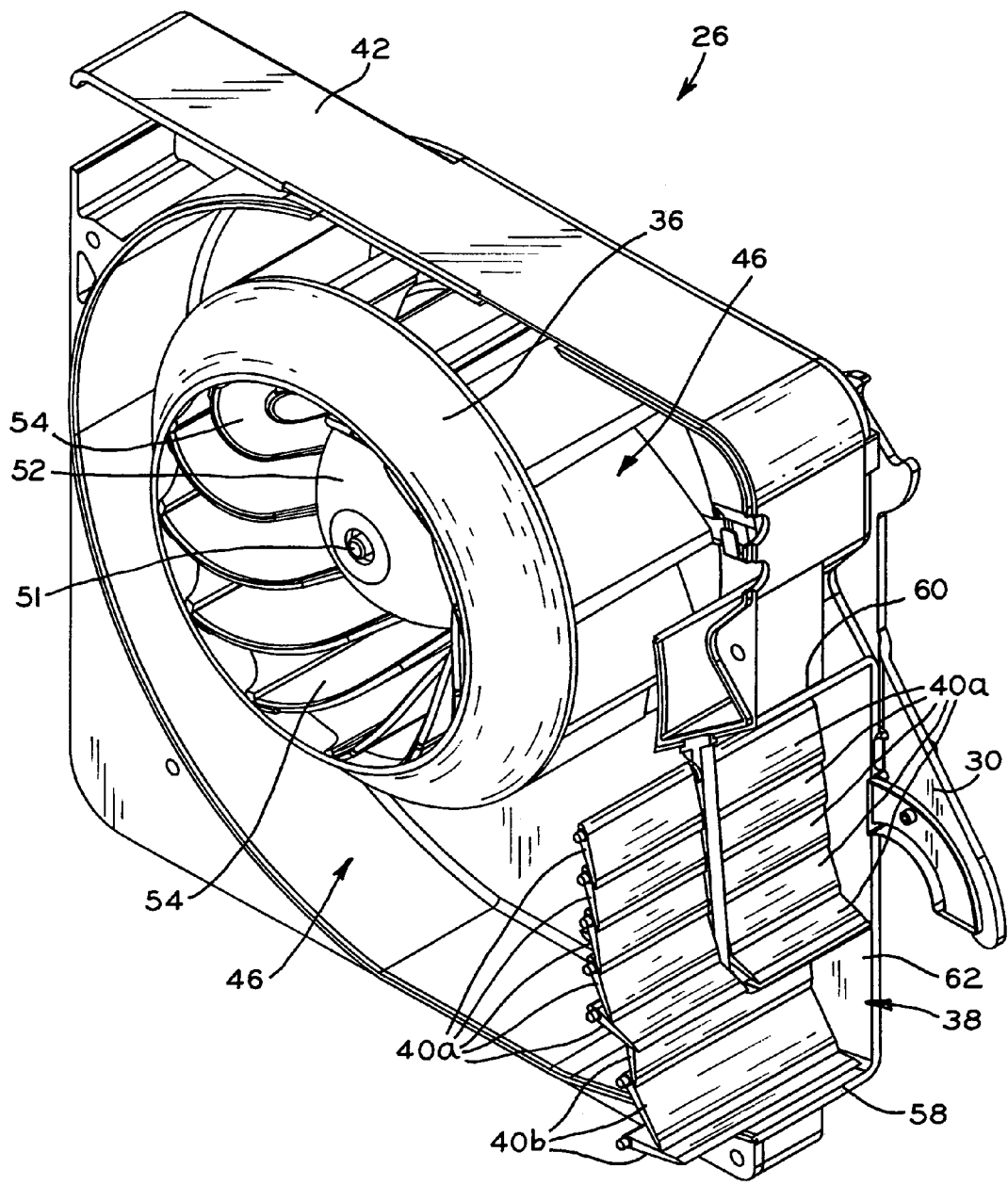
FIG. 5 is a perspective view of the blower of FIG. 3, with the second housing member removed such that the internal components of the blower are visible.

Referring to FIGS. 3–5, blower 26 is shown in a first orientation. Blower 26 generally includes blower housing 32 including first housing member 42 and second housing member 44 which are attached to one another in a suitable manner, such as by fasteners, welding, or adhesive, to define an interior cavity 46 (FIGS. 5 and 6) within blower housing 32 in which motor 34 and impeller 36 are disposed. First and second housing members 42 and 44 may be made of a rigid molded plastic material, or may be formed of metal.

Figure 6:
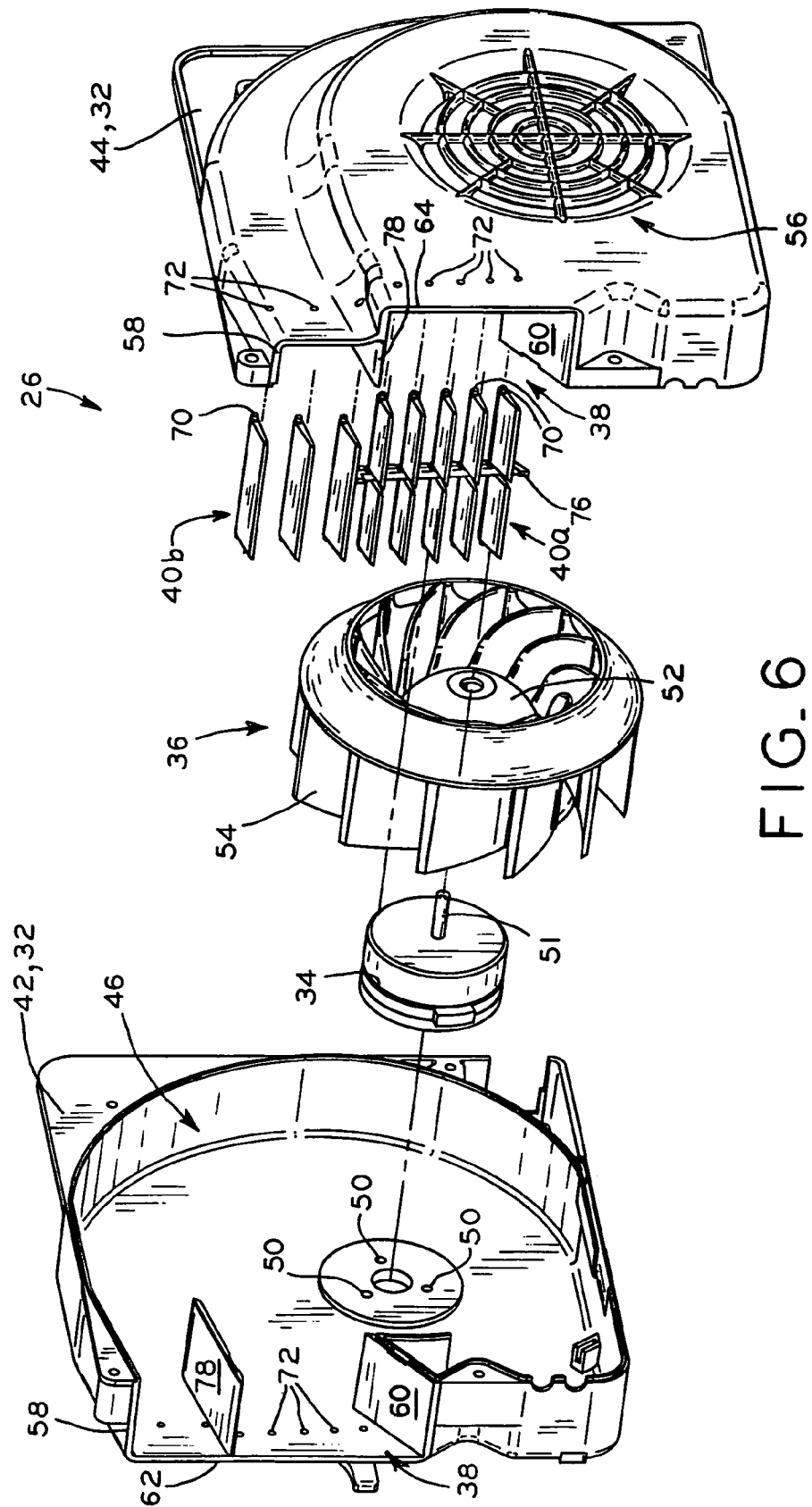
FIG. 6 is an exploded view of the blower of FIG. 3.

Referring to FIGS. 4 and 6, first housing member 42 includes a plurality of mount holes 50 which receive fasteners (not shown) to mount motor 34 to first housing member 42, as shown in FIG. 6, wherein motor 34 is disposed within interior cavity 46 of blower housing 32. Referring to FIGS. 5 and 6, motor 34 includes output shaft 51 to which impeller 36 is attached, and impeller 36 includes central hub 52 which is attached to outlet shaft 51 of motor 34. When blower 26 is assembled, motor 34 is disposed within central hub 52 of impeller 36, which conserves space within interior cavity 46 of blower housing 32 and allows motor 34 to be positioned internally within blower housing 32 rather than attached externally to blower housing 32. A plurality of fins 54 extend radially about central hub 52 of impeller 36. Impeller 36 may be made of a rigid plastic material or of metal, for example. As shown in FIGS. 3 and 6, second housing member 44 includes air inlet 56 with an inlet guard, through which air is drawn into interior cavity 46 of blower housing 32 by rotation of impeller 36.

Blower housing 32 includes outlet 38 defined between first and second housing members 42 and 44 through which exhaust air is discharged from interior cavity 46 of blower housing 26 upon rotation of impeller 36. Outlet 38 is generally shaped as a rectangular opening in blower housing 32 defined between first and second housing members 42 and 44 and, as shown in FIG. 6, generally includes outer wall 58, cutoff wall 60, and a pair of side walls 62 and 64. As described below, outlet 38 includes an anti-reverse flow feature including a plurality of louvers 40 rotatably fitted within outlet 38.

Figure 7:
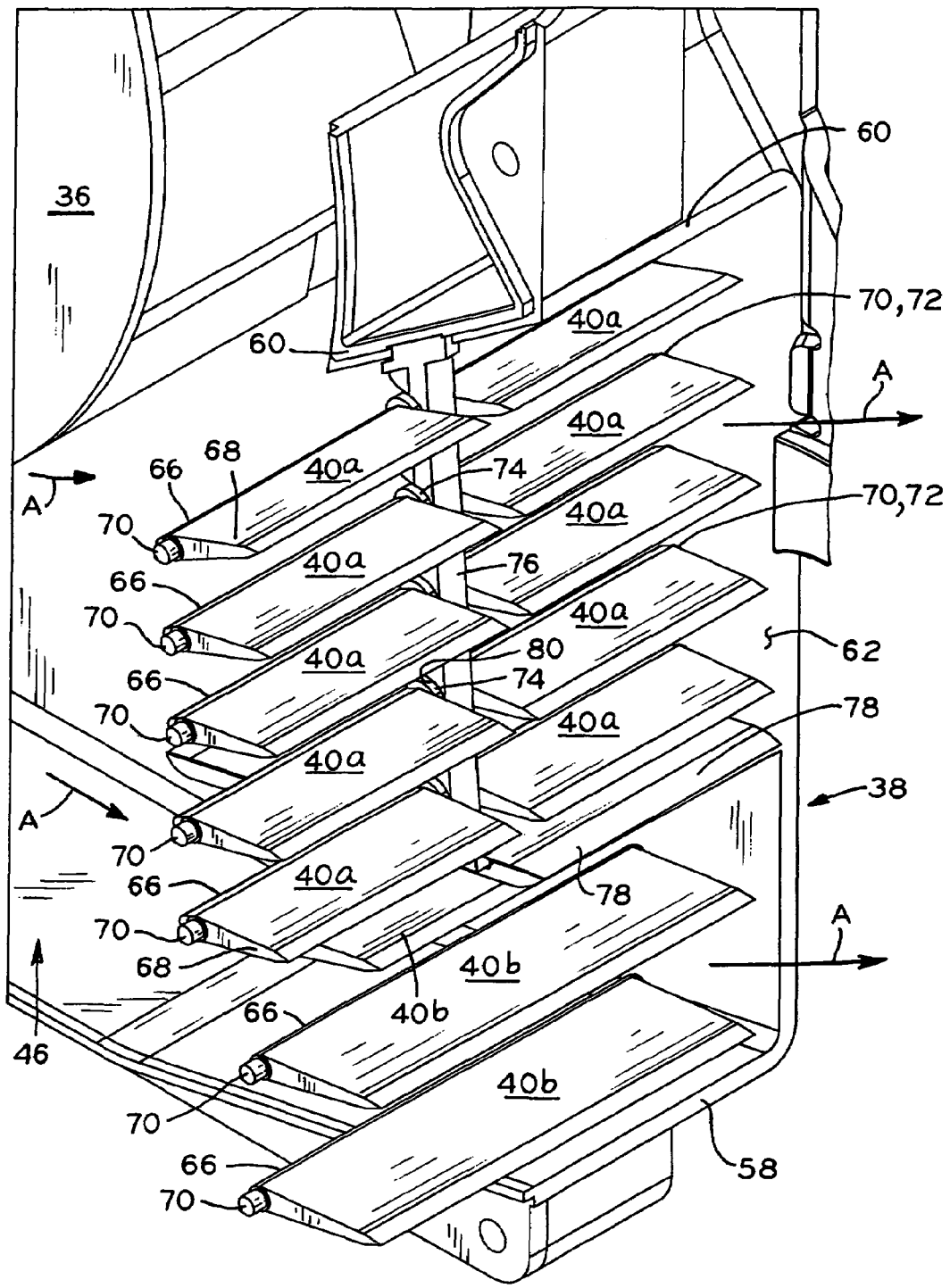
FIG. 7 is a fragmentary perspective view of the outlet of the blower of FIG. 5, showing the louvers in an open position corresponding to airflow through the blower.

Referring to FIG. 7, louvers 40 generally include first louvers 40a having a relatively shorter width, and second louvers 40b having a relatively longer width. Referring to FIGS. 11 and 12, each louver 40 has a generally airfoil-shaped profile, including a tapered leading portion 66 and a tapered trailing portion 68. Louvers 40 may be made of a lightweight plastic material such that louvers offer minimal resistance to opening upon contact with airflow from impeller 36, even when impeller 36 is operating at low speeds. Louvers 40 have a region of maximum thickness adjacent leading portion 66, and gradually taper in thickness throughout trailing portion 68 in a direction away from leading portion 66.

Each louver 40 additionally includes a pair of cylindrical pivot posts 70 integrally formed therewith, which are located proximate leading portion 66 for pivotal attachment of louver 40 to blower housing 32, as described below. Each louver 40 additionally includes a width W and a length L, wherein the width W of each louver 40 is slightly smaller that the corresponding width of outlet 38 of blower housing 32, such that each louver 40 may freely pivot within outlet 38 without frictional resistance with side walls 62 and 64, yet louvers may substantially block outlet 38 when closed. Preferably, pivot posts 70 are located within the first 40% of the length L of louvers 40 from the edge of leading portion 66, more preferably within the first 30% of the length L, and most preferably within the first 20% of the length L. As shown in FIGS. 7–10, louvers 40 are mounted within outlet 38 of blower housing 32 such that leading portions 66 of louvers 40 are disposed proximally of impeller 36 and trailing portions 68 of louvers 40 are disposed distally of impeller 36.

Figure 8:
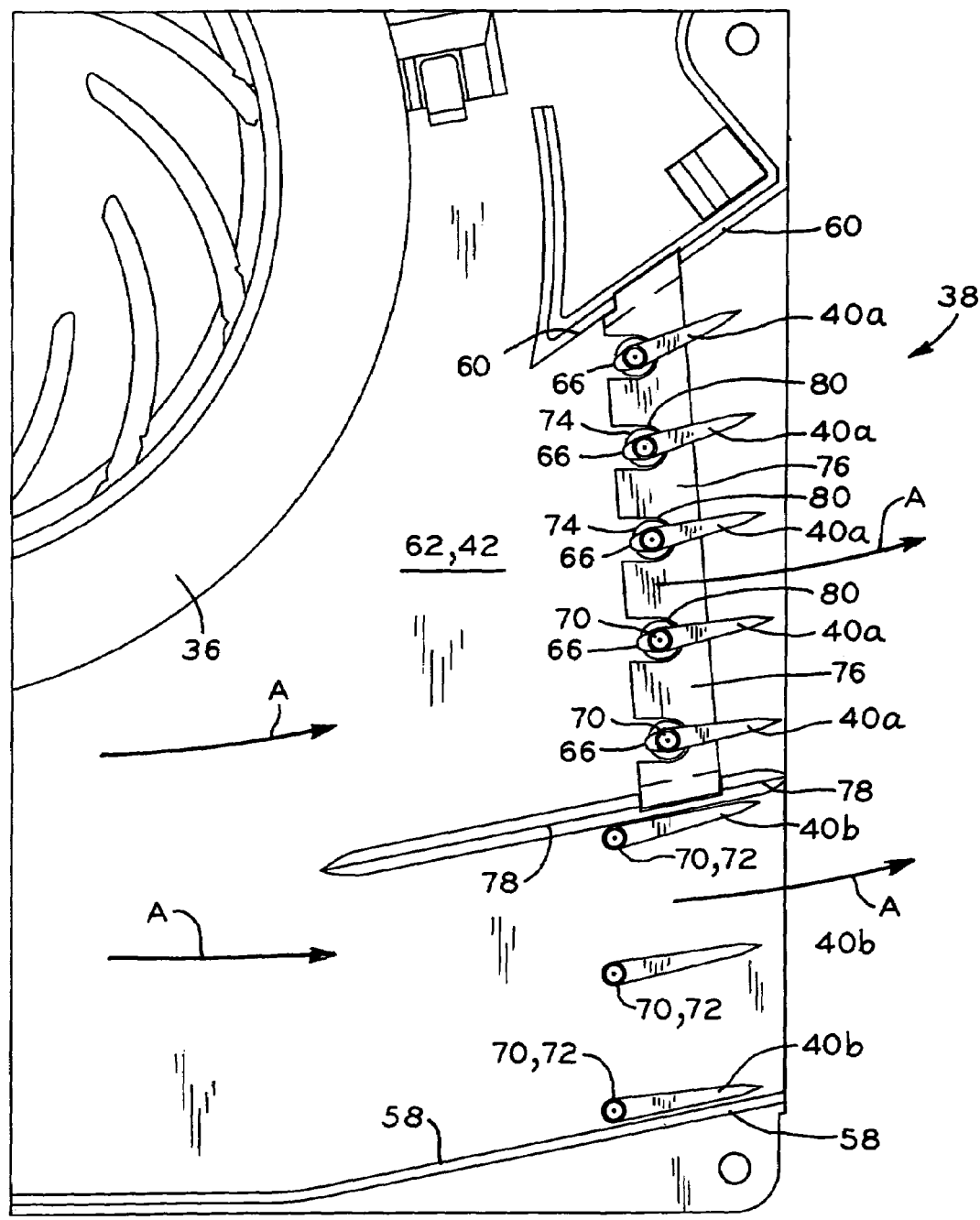
FIG. 8 is a side view of FIG. 7.

Referring to FIGS. 6–10, first louvers 40a are mounted within outlet 38 of blower housing 32 by capturing pivot posts 70 of first louvers 40a within corresponding cylindrical mounting holes 72 in side walls 62 and 64 of first and second housing members 42 and 44 when first and second housing members 42 and 44 are joined. As best shown in FIGS. 7 and 8, first louvers 40a are molded in pairs, with cylindrical pivot portion 74 therebetween. Louver support 76 is attached to first housing member 42 and to a horizontal dividing wall 78 defined between first and second housing members 42 and 44. Louver support 76 is disposed intermediate horizontally adjacent pairs of first louvers 40a, and includes recesses 80 in which cylindrical pivot portions 74 of first louvers 40a are received. Similarly, as shown in FIG. 6, pivot posts 70 of second louvers 40b are captured within corresponding cylindrical mounting holes 72 in side walls 62 and 64 of first and second housing members 42 and 44 when first and second housing members 42 and 44 are joined.

Referring to FIGS. 7–10, an uppermost first louver 40a is disposed adjacent cutoff wall 60, which is defined between first and second housing members 42 and 44. A lowermost first louver 40a, and an uppermost second louver 40b, are disposed adjacent dividing wall 78, which is defined between first and second housing members 42 and 44. A lowermost second louver 40b is disposed adjacent outer wall 58, which is defined between first and second housing members 42 and 44.

Referring to FIGS. 7 and 8, louvers 40 are shown in a first or open position which corresponds to rotation of impeller 36 by motor 34 within blower 26. Specifically, rotation of impeller 36 generates an airflow A through inlet 56 (FIG. 3) of blower housing 32 and thence outwardly through outlet 38 of blower housing 32. Upon contact of airflow A with louvers 40, louvers 40 pivot to their open positions shown in FIGS. 7 and 8, in which louvers 40 are each disposed in a substantially horizontal orientation. In this position, leading portion 66 of each louver 40 is positioned directly into the flow path of airflow A, such that the airfoil profile of louvers 40 positions the louvers 40 in their open position shown in FIGS. 7 and 8 while offering minimal resistance to the flow of air around louvers 40 and through outlet 38. Additionally, the pivotal connection of louvers 40 at pivots posts 70, which are located proximate leading portion 66 of louvers as described above, allows most of airflow A to contact trailing portion 68 of louvers 40 upon rotation of impeller 38, such that louvers 40 easily pivot to their open position.

Figure 9:
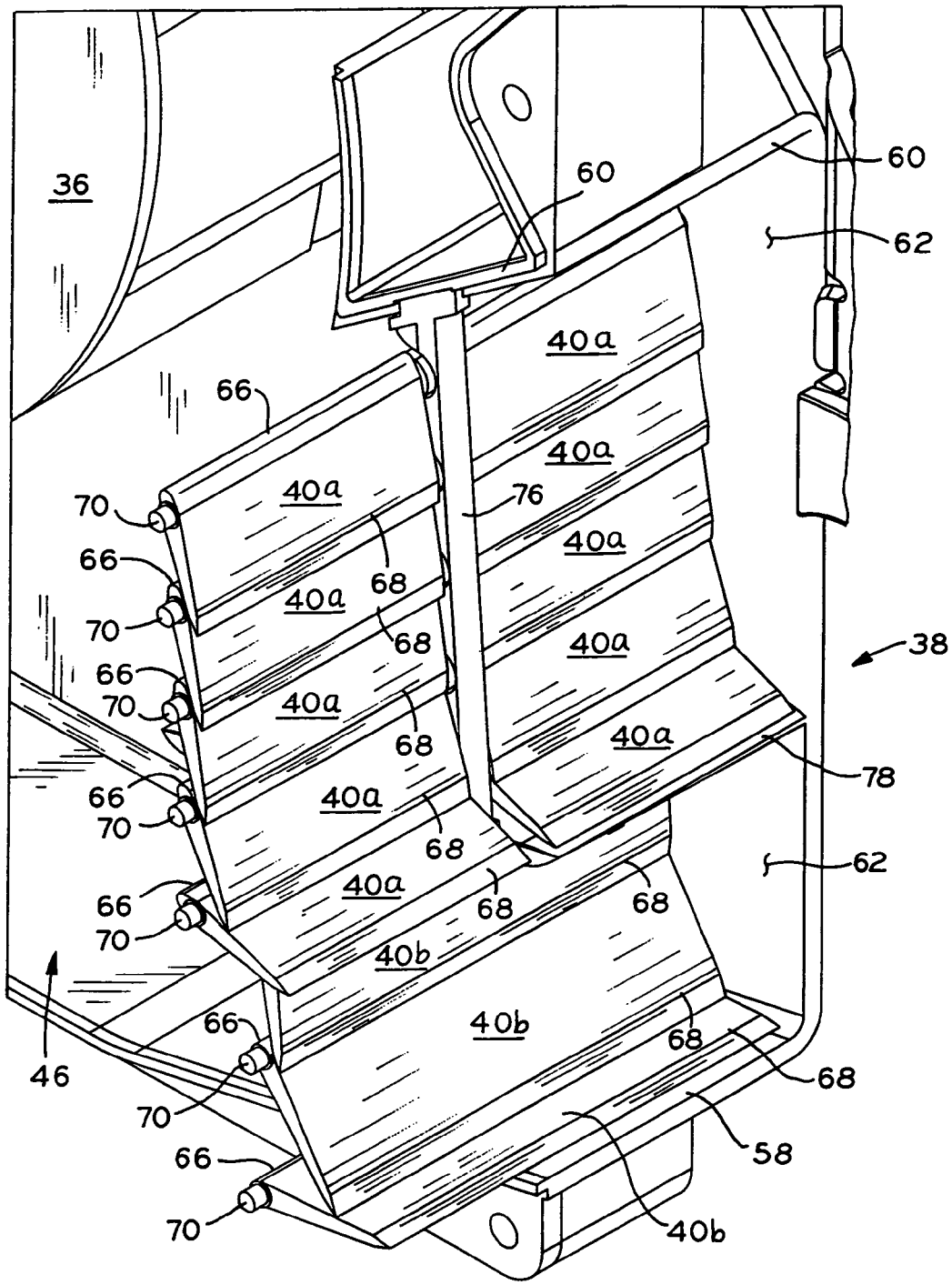
FIG. 9 is a fragmentary perspective view of the outlet of the blower of FIG. 5, showing the louvers in a closed position corresponding to the impeller of the blower being stationary.
Figure 10:
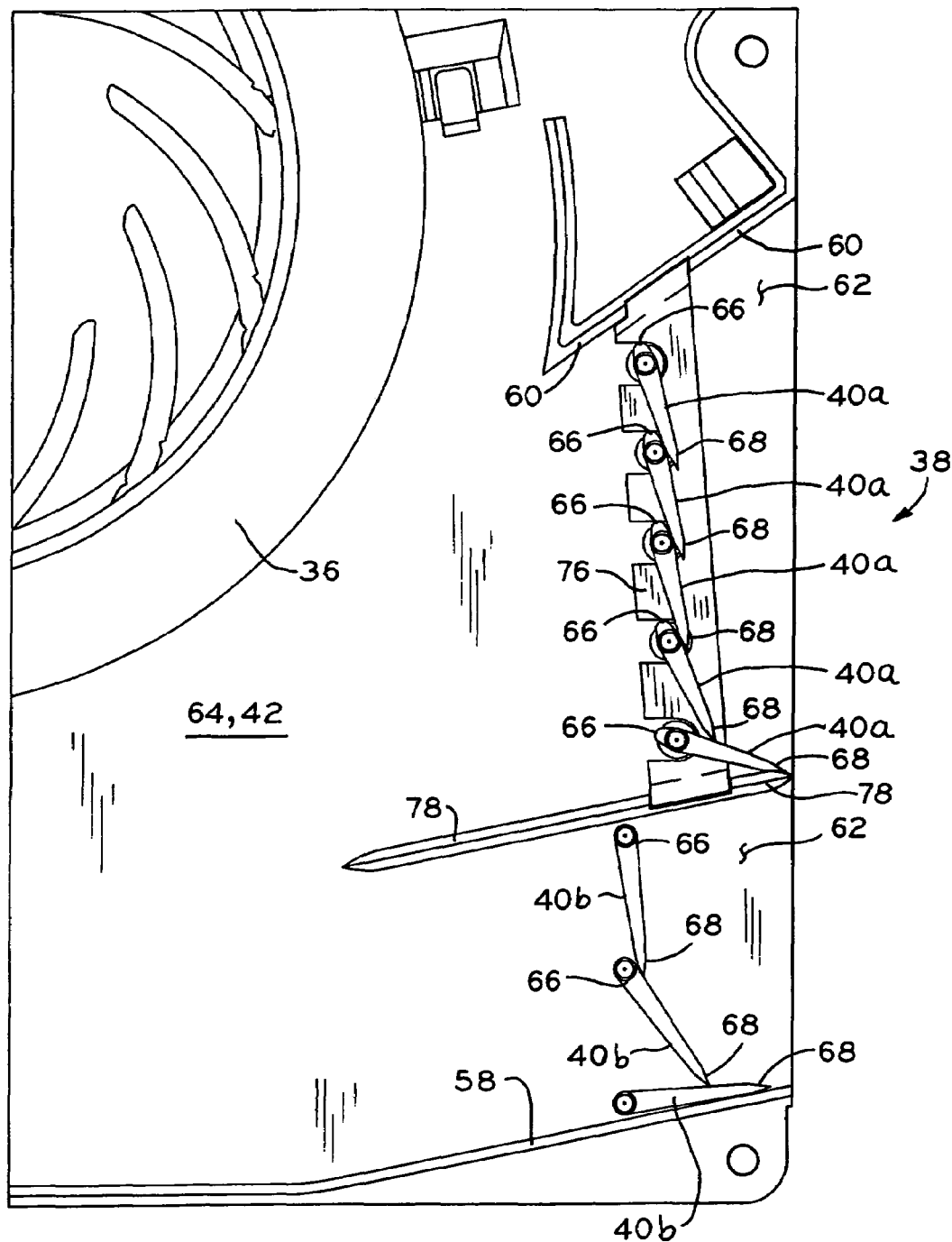
FIG. 10 is a side view of FIG. 9.

Upon stoppage of the rotation of impeller 36, which may occur due to shutdown of motor 34 by machine 20 when machine 20 is off, or by failure of motor 34, for example, airflow A ceases from inlet 56 through outlet 38 of blower 26. As the airflow A first reduces and eventually ceases, louvers 40 are rotatably positioned by gravity to a second or closed position shown in FIGS. 9 and 10. In this position, louvers 40 are disposed in contacting, overlapping relationship with one another. Specifically, as shown in FIGS. 9 and 10, the trailing portions 68 of first louvers 40a contact the leading portions 66 of lower adjacent first louvers 40a, with the trailing portion 68 of the lowermost first louver 40a contacting dividing wall 78 of outlet 38. In a similar manner, each of the trailing portions 68 of second louvers 40b contacts the leading or trailing portions 66 or 68 of a lower adjacent second louver 40b, with the lowermost second louver 40b contacting outer wall 58 of outlet 38. As may be seen from FIGS. 9 and 10, the distance between the pivot points of vertically adjacent louvers 40 is shorter than the length of the louvers 40, such that vertically adjacent louvers 40 overlap with respect to one another. In this position, first and second louvers 40a and 40b cooperate with one another and with dividing and outer walls 78 and 58, respectively, of outlet 38 to substantially block airflow through outlet 38 from externally of blower 26. Thus, for example, if one blower 26 of machine 20 fails while the remainder of the blowers 26 are still operable, louvers 40 of the failed blower 26 block the outlet 38 of the failed blower 26 as shown in FIGS. 9 and 10 to prevent air from being drawn through outlet 38 of the failed blower 26 and into machine 20.

Figure 14:
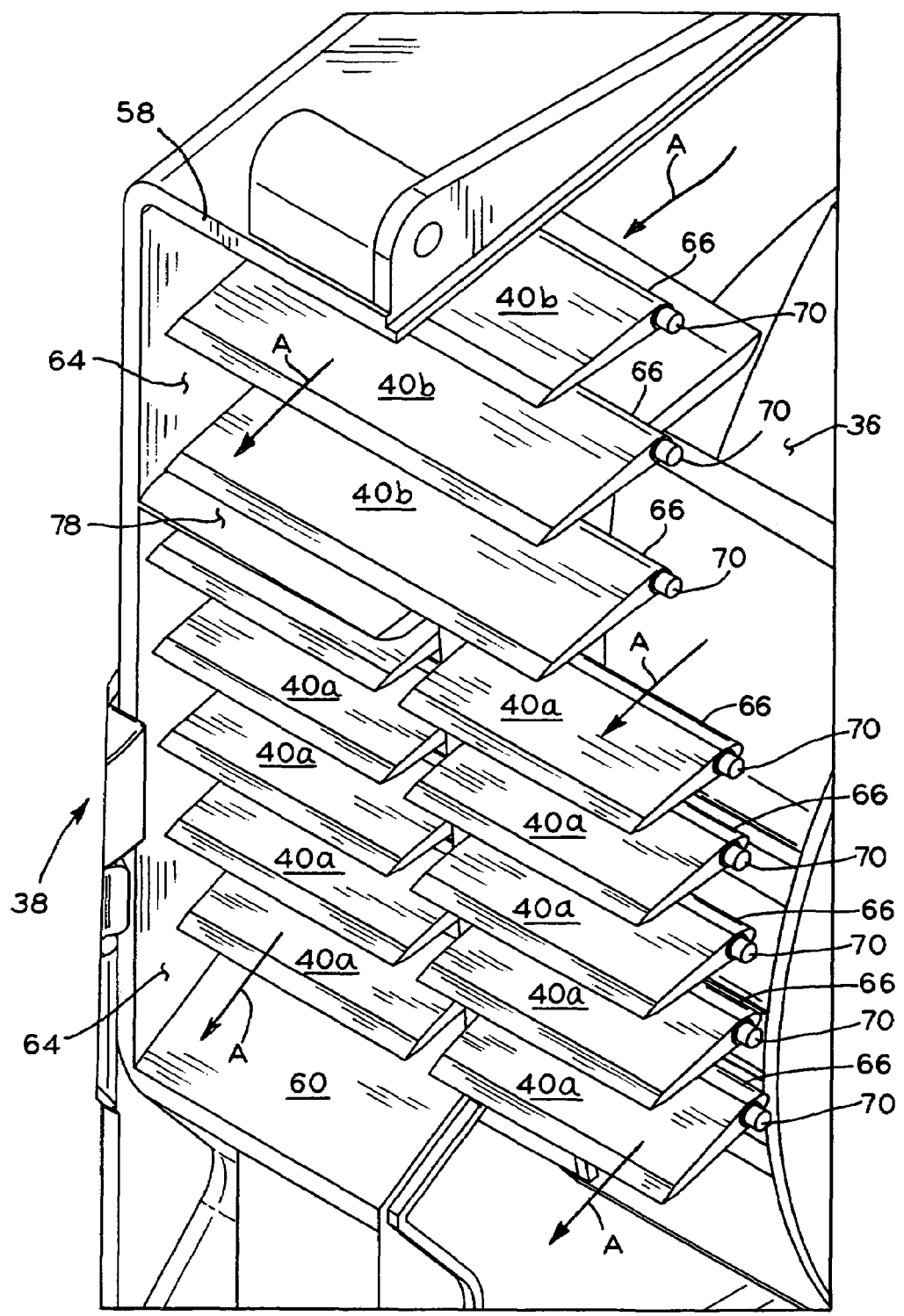
FIG. 14 is a is a fragmentary perspective view of the outlet of the blower of FIG. 13, showing the louvers in an open position corresponding to airflow through the blower.
Figure 15:
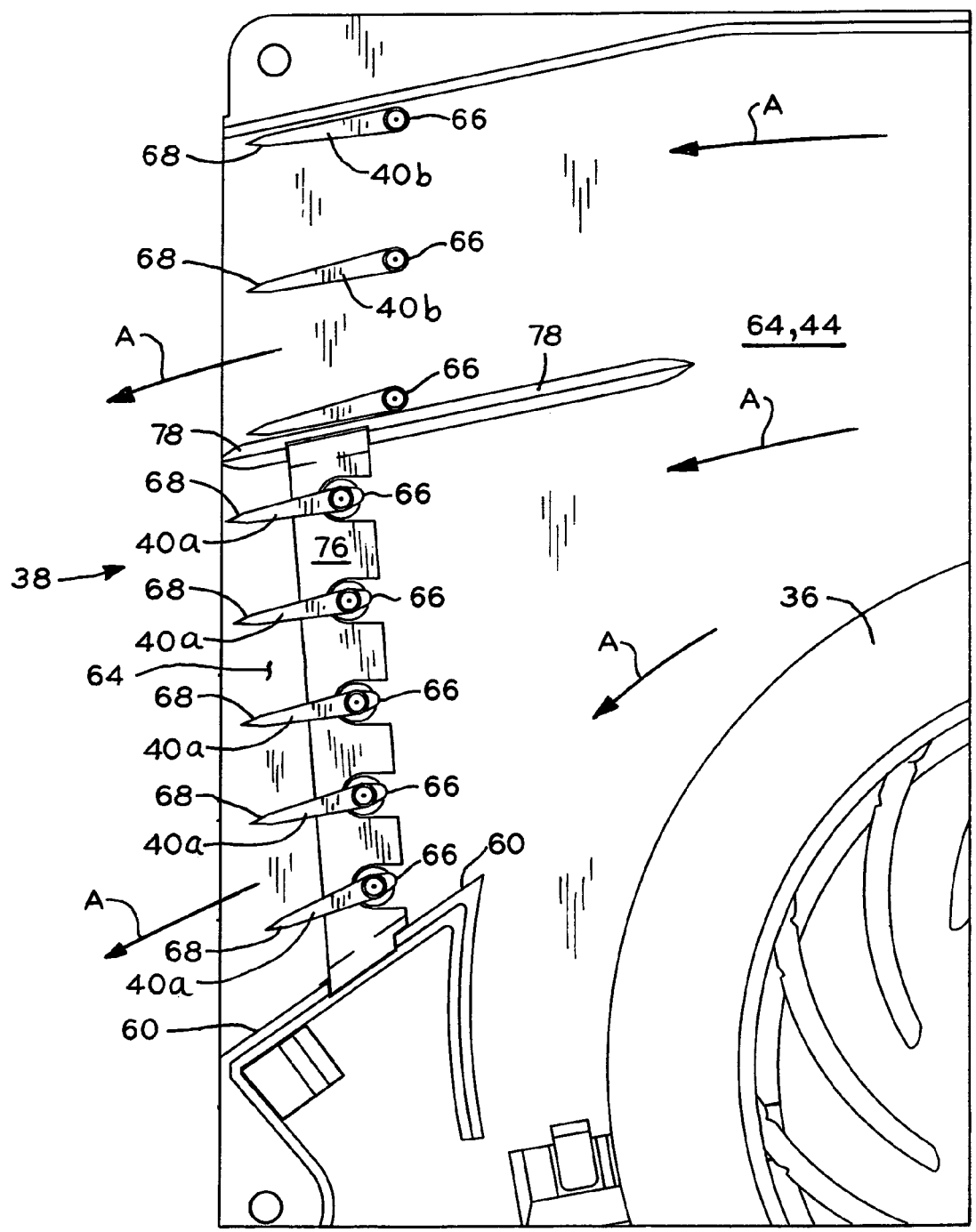
FIG. 15 is a side view of FIG. 14.
Figure 16:
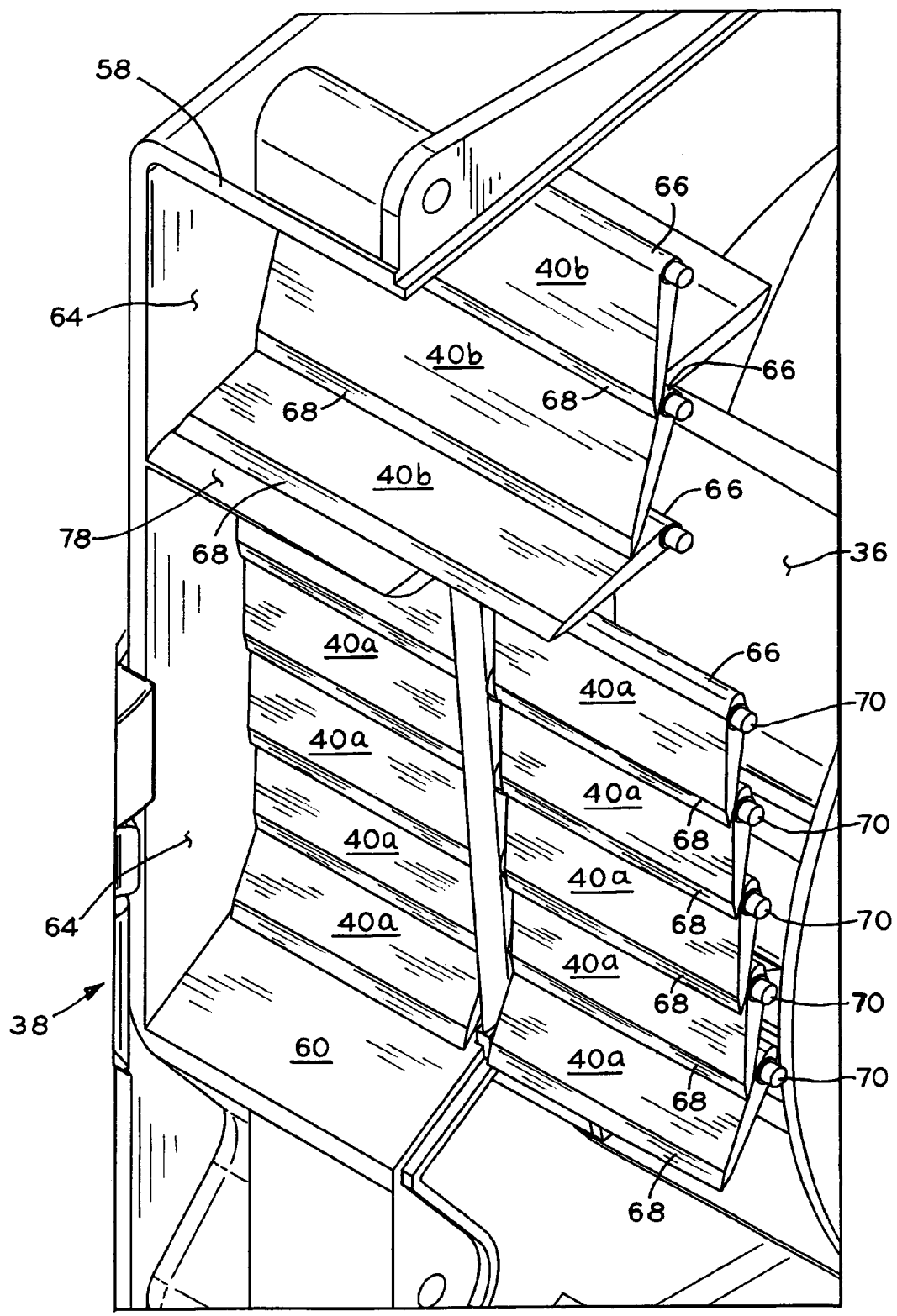
FIG. 16 is a fragmentary perspective view of the outlet of the blower of FIG. 13, showing the louvers in a closed position corresponding to the impeller of the blower being stationary.

Referring to FIGS. 13–17, the same blower 26 of FIGS. 3–10 is shown in a second orientation in which blower 26 is inverted 180° with respect to the first orientation thereof which is shown in FIGS. 3–10, it being understood that blower 26 of FIGS. 13–17 is identical to blower 26 of FIGS. 3–10. Advantageously, as shown in FIGS. 14–16, louvers 40 of blower 26 are operable in the substantially the same manner as that described above when blower 26 is disposed in the orientation shown in FIGS. 13–17.

Referring to FIGS. 14 and 15, louvers 40 are shown in a first or open position which corresponds to rotation of impeller 36 by motor 34 within blower 26. Specifically, rotation of impeller 36 generates an airflow A through inlet 56 of blower housing 32 and thence outwardly through outlet 38 of blower housing 32. Upon contact of airflow A with louvers 40, louvers 40 pivot to their open positions shown in FIGS. 14 and 15, in which louvers 40 are each disposed in a substantially horizontal orientation. In this position, leading portion 66 of each louver 40 is positioned directly into the path of airflow A, such that the airfoil profile of louvers 40 positions the louvers 40 in their open position shown in FIGS. 14 and 15 while offering minimal resistance to the flow of air around louvers 40 and through outlet 38.

Figure 17:
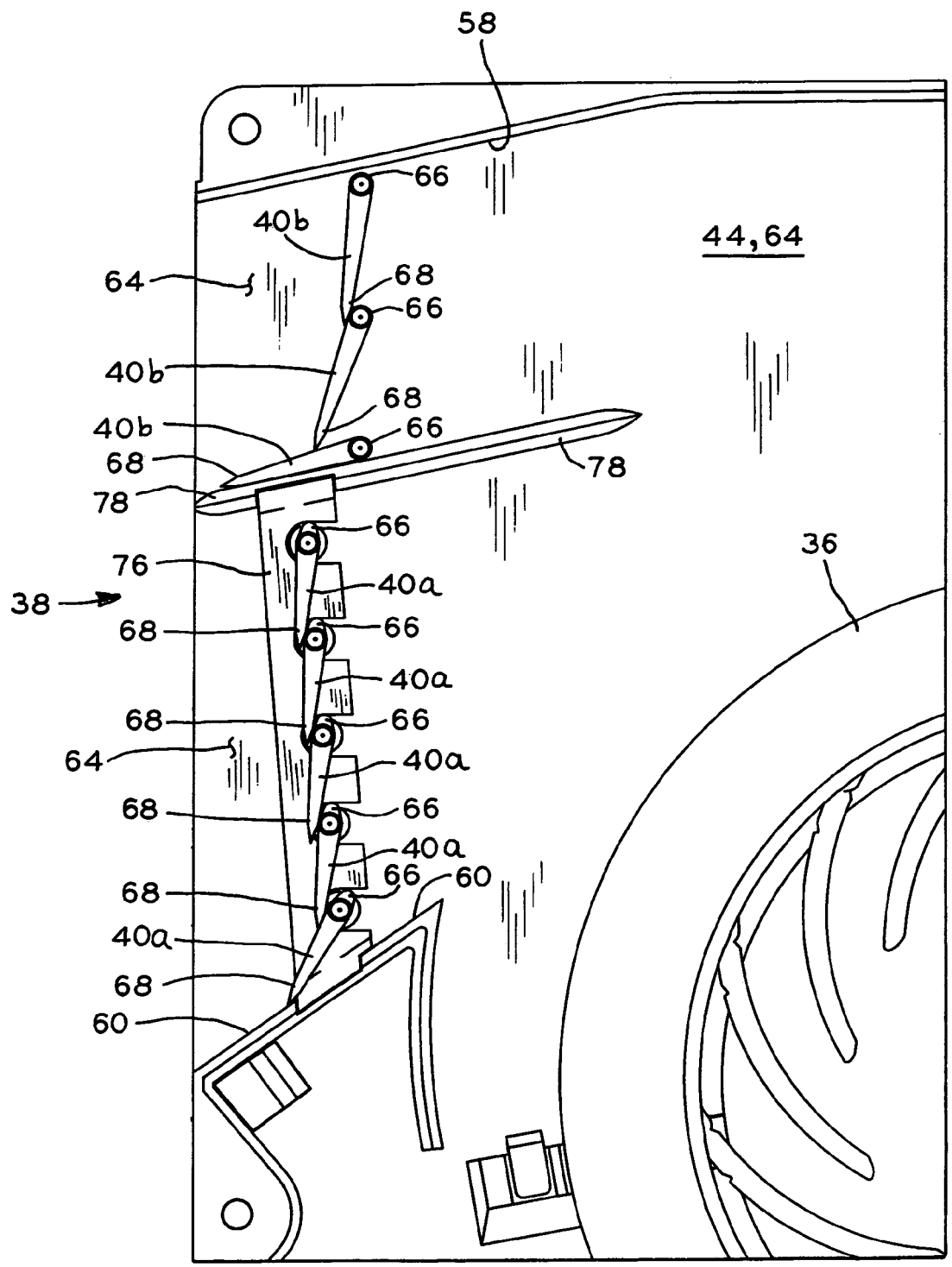
FIG. 17 is a side view of FIG. 16.

Upon stoppage of the rotation of impeller 36, airflow A ceases from inlet 56 through outlet 38 of blower 26. As the airflow A reduces and eventually ceases, louvers 40 are rotatably positioned by gravity to a second or closed position shown in FIGS. 16 and 17. In this position, louvers 40 are disposed in contacting, overlapping relationship with one another. Specifically, as shown in FIGS. 16 and 17, the trailing portions 68 of first louvers 40a contact the leading portions 66 of lower adjacent first louvers 40a, with the trailing portion 68 of the lowermost first louver 40a contacting cutoff wall 60 of outlet 38. In a similar manner, each of the trailing portions 68 of second louvers 40b contacts the leading or trailing portions 66 or 68 of a lower adjacent second louver 40b, with the lowermost second louver 40b contacting dividing wall 78 of outlet 38. In this position, first and second louvers 40a and 40b cooperate with one another and with cutoff and dividing walls 60 and 78 of outlet 38 to substantially block airflow through outlet 38 from externally of blower 26.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A blower, comprising:
   a blower housing having an outlet including opposing first and second walls connecting a pair of opposing side walls;
   an impeller rotatable within said housing and positioned to generate an airflow through said outlet;
   a plurality of louvers mounted between said side walls proximate said outlet, including a first louver disposed adjacent said first wall, a second louver disposed adjacent said second wall, and at least one third louver disposed between said first and second louvers; and
   said blower housing movable between a first orientation and a second orientation which is inverted with respect to said first orientation and, in each of said first and second orientations, said louvers are moveable between a first position in which said louvers are positioned by contact with said airflow upon rotation of said impeller to allow the airflow to exit said blower housing through said outlet between said louvers, and a second position in which said louvers are positioned by gravity to cooperatively block said outlet when said impeller is stationary.

2. The blower of claim 1, wherein each of said first and second louvers have a length, and said first and second louvers are each mounted to said side walls of said blower housing at respective locations which are spaced from said first and second walls by distances less than said lengths of said first and second louvers.

3. The blower of claim 1, wherein in said second position, said louvers are positioned by gravity in blocking relationship to the entry of air into said blower housing from externally of said blower housing through said outlet.

4. The blower of claim 1, wherein in said first position, said louvers are disposed in non-contacting, substantially parallel relationship with respect to one another, and in said second position, said louvers are disposed in contacting overlapping relationship with respect to one another.

5. The blower of claim 1, wherein said louvers each include a leading portion disposed proximally of said impeller and a trailing portion disposed distally of said impeller, each said louver pivotally mounted to said side walls of said blower housing proximate said leading portion thereof.

6. The blower of claim 5, wherein said louvers are pivotally mounted to said side walls of said blower housing at a location on said louvers which is disposed within the first 40% of said length from said leading portion.

7. The blower of claim 1, wherein in said second position, said leading portions of said louvers each contact one of said blower housing and another said louver, and said trailing portions of said louvers each contact one of said blower housing and another said louver.

8. The blower of claim 1, wherein said outlet has a first width defined between said side walls, and said louvers each have a second width corresponding substantially to said first width of said outlet.

9. The blower of claim 1, wherein each of said louvers includes a pair of opposing pivot posts extending therefrom, said pivot posts pivotally received within opposing recesses in said side walls of said blower housing.

10. The blower of claim 1, further comprising a motor disposed within said blower housing, said motor drivably coupled to said impeller.

11. In combination:

an enclosure having at least one inlet; and a blower mounted in said enclosure, said blower comprising:
- a blower housing having an outlet with lower and upper opposing walls and a pair of opposing side walls;
- an impeller rotatable within said housing and positioned to generate an airflow through said at least one inlet of said enclosure to said outlet;
- at least two louvers movably mounted to said side walls of said blower housing proximate said outlet, said louvers moveable between a first position in which said louvers are positioned by contact with said airflow upon rotation of said impeller in a substantially parallel relationship with respect to one another, and a second position in which said louvers are positioned by gravity in overlapping relationship with respect to one another to substantially block said outlet when said impeller is stationary, a lowermost one of said louvers pivotally mounted to said side walls of said blower housing adjacent said lower wall and an uppermost one of said louvers pivotally mounted to said side walls of said blower housing adjacent said upper wall;
- in said first position, said louvers allow the airflow to pass through said outlet, and in said second position, said louvers substantially prevent passage of air through said outlet from externally of said blower housing, wherein, in said second position, said uppermost louver is positioned by gravity in a vertical position to close an uppermost portion of said outlet, and said lowermost louver is positioned by gravity in a horizontal position in contacting relationship with said lower wall of said housing.

12. The combination of claim 11, wherein said blower housing includes an inlet in airflow communication with said at least one inlet of said enclosure.

13. The combination of claim 11, wherein said louvers contact one another in said second position and do not contact one another in said first position.

14. The combination of claim 11, wherein said louvers have a thin, elongate profile, each of said louvers including a leading portion disposed proximally of said impeller and a trailing portion disposed distally of said impeller, each said louver pivotally mounted to said side walls of said blower housing proximate said leading portion thereof.

15. The combination of claim 14, wherein said louvers each have a length, said louvers pivotally mounted to said side walls of said blower housing at a location on said louvers which is disposed within the first 40% of said length from said leading portion.

16. The combination of claim 14, wherein said louvers are tapered at said leading portions and said trailing portions and have a cross-sectional thickness which gradually decreases from said leading portion to said trailing portion.

17. The combination of claim 14, wherein in said second position, said leading portions of said louvers each contact one of said blower housing and another said louver, and said trailing portions of said louvers each contact one of said blower housing and another said louver.

18. The combination of claim 11, further comprising a motor disposed within said blower housing, said motor drivably coupled to said impeller.

19. In combination:

an enclosure having at least one inlet; and a blower set, comprising:
- at least two identical blowers mounted in said enclosure, one said blower disposed in an inverted orientation with respect to another of said blowers, each said blower comprising:
  - a blower housing having an outlet;
  - an impeller rotatable within said housing and positioned to generate an airflow through said enclosure inlet to said outlet;
  - at least one louver disposed proximate said outlet, said louver moveable between a first position in which said louver is positioned by contact with said airflow upon rotation of said impeller to allow said airflow to exit said blower housing through said outlet, and a second position in which said louver is positioned by gravity to substantially block said outlet when said impeller is stationary.

20. The combination of claim 19, wherein said blower housing includes an inlet in airflow communication with said at least one inlet of said enclosure.

21. The combination of claim 19, wherein each said blower includes at least two of said louvers pivotally mounted within said blower housing proximate said outlet.

22. The combination of claim 19, wherein in said first position, said louvers are disposed in non-contacting, substantially parallel relationship with respect to one another, and in said second position, said louvers are disposed in contacting overlapping relationship with respect to one another.

* * * * *